United States Patent [19]

Jenq et al.

[11] Patent Number: 4,858,142
[45] Date of Patent: Aug. 15, 1989

[54] DIGITIZER EFFECTIVE RESOLUTION MEASUREMENT SYSTEM USING SINEWAVE PARAMETER ESTIMATION

[75] Inventors: Yih-Chyun Jenq, Lake Oswego; Philip S. Crosby, Portland, both of Oreg.

[73] Assignee: Tektronix, Inc., Beaverton, Oreg.

[21] Appl. No.: 81,943

[22] Filed: Aug. 5, 1987

[51] Int. Cl.$^4$ ............................................. G01R 23/16
[52] U.S. Cl. ................................. 364/487; 324/77 A
[58] Field of Search ............... 364/487, 486, 484, 481, 364/480; 328/14; 324/83 D, 77 A, 78 D, 78 Z; 377/50, 51

[56] References Cited

U.S. PATENT DOCUMENTS 4,606,008  8/1986  Wason ........................... 250/231 SE
4,686,560  8/1987  Balaban et al. ........................ 358/19

Primary Examiner—Bruce Y. Arnold
Assistant Examiner—Terry S. Callaghan
Attorney, Agent, or Firm—Daniel J. Bedell; Robert S. Hulse

[57] ABSTRACT

A method and apparatus for determining the effective bits of resolution of a digitizer wherein amplitude, frequency, phase angle and offset parameters characterizing a sinewave input signal to the digitizer are estimated from the waveform data sequence produced by the digitizer in response to the input signal. These estimated parameters are used to develop a model of the sinewave signal, and the effective bits of resolution of the digitizer are then determined by the comparing measured magnitudes of the sinewave signal as represented by the waveform data sequence to estimated magnitudes of the input signal being determined from the model.

13 Claims, 2 Drawing Sheets

DIGITIZER EFFECTIVE RESOLUTION MEASUREMENT SYSTEM USING SINEWAVE PARAMETER ESTIMATION

BACKGROUND OF THE INVENTION

The present invention relates to waveform digitizers in general and in particular to a system for measuring the effective resolution of a digitizer based on its output data sequence in response to an input sinewave.

A typical waveform digitizer periodically samples and stores the magnitude of an input signal and converts the stored samples to a waveform data sequence representing the time varying magnitude of the input signal. The "effective bits of resolution" of a digitizer are the number of bits of each element of its output waveform data sequence which reflect the magnitude of the input signal and which are substantially unaffected by noise. Random noise may cause variation in the timing of each sample, in the stored sample voltage, or in the magnitude of reference signals used in digitizing the sample voltage, all of which may cause random variations in the least significant bits of the digitizer output. Thus, although a particular digitizer may produce eight bit output data, when the three least significant bits vary with quantization noise in the system, the digitizer has only five effective bits of resolution.

A commonly used and more rigorous definition of effective bits of resolution is based on the assumption that the quantization noise is uniformly distributed throughout the range of a digitizer and that quantization errors from sample to sample are statistically independent. Based on these assumptions, the effective bits indication B of resolution of a digitizer is given by:

$$B = \text{Log}_2 \left[ \frac{\text{FullScale}}{\sqrt{12} \; RMSE} + 1 \right]$$

where FullScale is the value of the full scale output of the digitizer, and RMSE is the "root mean square error" of the digitized signal, $$RMSE = \left[ 1/N \sum_{k=0}^{N-1} [s_K - s_{K'}]^2 \right]^{\frac{1}{2}}$$

where N is the number of samples in the waveform data sequence produced by the digitizer in response to an input signal, $s_k$ is the value of the $k^{th}$ element of the waveform data sequence representing the value of the $k^{th}$ sample of an input signal, and $s'_k$ is the actual magnitude of the input signal at the time the $k^{th}$ sample was taken. To measure the effective bits of resolution of a digitizer, a test signal which varies in magnitude over the full scale input range of the digitizer is applied as input to the digitizer and the known behavior of the input signal is compared to the output data sequence produced by the digitizer in accordance with the above-described equations. Unfortunately the method of the prior art relies on use of a test signal having a variable magnitude that can be accurately controlled preferably in a continuous fashion over the input range of the digitizer, and signal generators capable of producing such test signals are expensive and usually require frequent calibration.

SUMMARY OF THE INVENTION

In accordance with one aspect of the invention, the amplitude, frequency, phase angle and offset parameters characterizing a sinewave input signal to a digitizer are estimated from the waveform data sequence produced by the digitizer in response to the input signal. These estimated parameters are used to develop a digital model of the sinewave input signal:

$$s'_k = \widetilde{A} \sin(2\pi k \widetilde{f}/f_s + \widetilde{\theta}) + \widetilde{D}$$

where $\widetilde{A}$ is the estimated amplitude parameter, $\widetilde{f}$ is the estimated frequency parameter, $\widetilde{\theta}$ is the estimated phase angle parameter, $\widetilde{D}$ is the estimated offset parameter, $f_s$ is the sampling frequency, and k is an integer. Thereafter the resolution B (effective bits) of the digitizer is determined in accordance with the expressions:

$$B = \text{Log}_2 \left[ \frac{\text{FullScale}}{\sqrt{12} \; RMSE} + 1 \right]$$

and $$RMSE = \left[ 1/N \sum_{k=0}^{N-1} [s_K - s_{K'}]^2 \right]^{\frac{1}{2}}$$

where N is the number of data elements in the waveform data sequence produced by the digitizer in response to the sinewave input signal, and $s_k$ is the value of the $k^{th}$ element of the waveform data sequence representing the value of the kth sample of an input signal.

In accordance with another aspect of the invention, the offset parameter is estimated in accordance with the equation:

$$\widetilde{D} = \sum_{k=0}^{N-1} w_k s_k / \sum_{k=0}^{N-1} w_k$$

where $w_k$ is a window sequence. The amplitude parameter is estimated in accordance with the equation $$\widetilde{A} = \sum_{k=0}^{N-1} w_k [s_k - \widetilde{D}]^{\frac{1}{2}} / \sum_{k=0}^{N-1} w_k$$

and the frequency and offset parameters are estimated in accordance with the equations $$\widetilde{f} = (\tfrac{1}{2}\pi) \frac{\text{Sum}U \cdot \text{Sum}UTX - \text{Sum}UT \cdot \text{Sum}UX}{\Delta}$$

and $$\widetilde{\theta} = (\tfrac{1}{2}\pi) \frac{\text{Sum}UX \cdot \text{Sum}UTT - \text{Sum}UT \cdot \text{Sum}UTX}{\Delta}$$

where
Sum$U = \Sigma u_k$
Sum$UT = \Sigma u_k t_k$
Sum$UTT = \Sigma u_k t_k t_k$
Sum$UX = \Sigma u_k x_k$
Sum$UTX = \Sigma u_k t_k x_k$
$\Delta = \text{Sum}U \cdot \text{Sum}UTT - \text{Sum}UT \cdot \text{Sum}UT$
$\hat{s}_k = (s_k - \widetilde{D})/\widetilde{A}, \; k=0, 1, \ldots, N-1$
$u_k = 1 - (\hat{s}_k)^2, \; k=0, 1, \ldots, N-1$ $x_k = \arcsin(\hat{s}_k)$, subject to monotonic condition (i.e., $X_k$ increasing monotonically as k increases) and
$t_k = k/f_s$, k=0, 1, ..., N−1

Estimation of the four sinewave parameters in accordance with the present invention is non-iterative and is carried out quickly with high precision by a digital computer. Estimation errors are obtained in closed form and hence can be controlled. The measurement of effective bits of resolution of a digitizer utilizing a sinewave model developed from estimated parameters, rather than from known parameters of an input signal, gives consistent, highly accurate results for digitizers with effective resolutions as low as three bits.

It is accordingly an object of the invention to provide a method and apparatus for measuring parameters of a sinewave.

It is another object of the invention to provide a method and apparatus for measuring the effective bits of resolution of a digitizer.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

FIG. 1 is a block diagram of an apparatus for measuring parameters of a sinewave signal and for determining the effective bits of resolution of a digitizer; and FIG. 2 is a flow chart for programming the computer of FIG. 1 to determine parameters of the sinewave input signal to the digitizer of FIG. 1 and to compute the effective bits of resolution of the digitizer.

DETAILED DESCRIPTION

Figure 1:
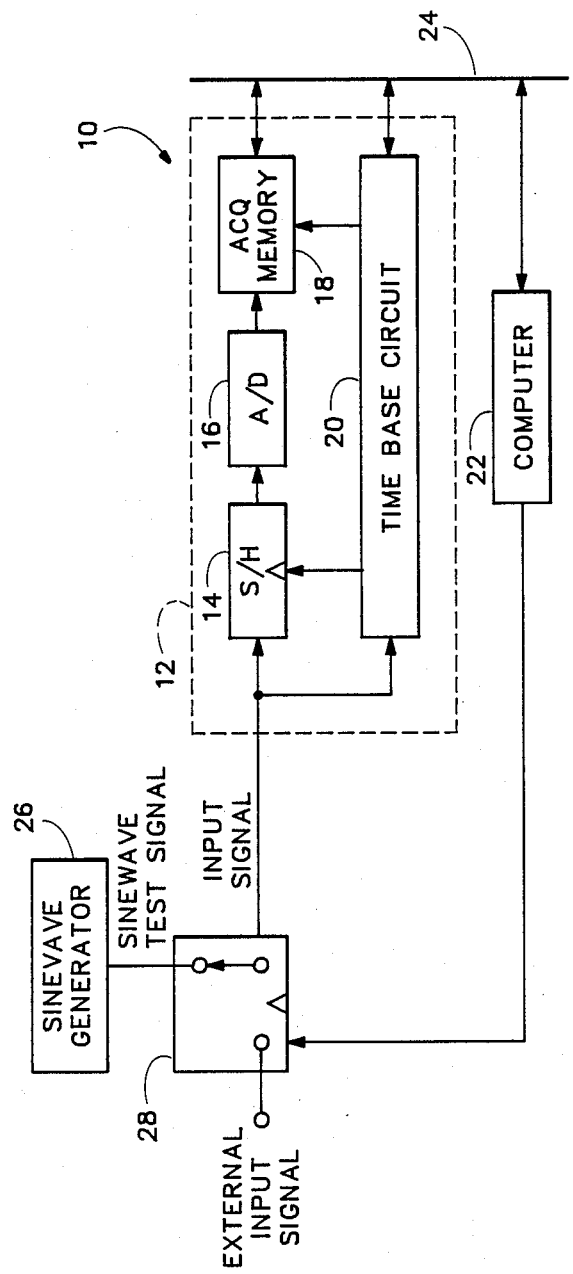

FIG. 1 shows in block diagram form a system 10 for measuring parameters of a sinewave signal and for determining effective bits of resolution of a digitizer 12. The digitizer 12 includes a sample and hold (S/H) circuit 14 for capturing a voltage sample of an input signal to the digitizer, an analog-to-digital (A/D) converter 16 for converting the voltage sample to representative digital data, and an acquisition memory 18 for storing the A/D converter output data. Digitizer 12 also includes a time base circuit 20 for periodically producing a strobe signal applied to S/H circuit 14 in response to each pulse of an internally generated clock signal, the strobe signal causing S/H circuit 14 to sample input signal. Time base circuit 20 also produces signals which address and write enable acquisition memory 18, the current address of memory 18 being incremented between each sampling operation so that data produced by A/D converter 16 in response to input signal samples is stored sequentially in acqusition memory 18.

The time base circuit 20 begins strobing S/H circuit 14 in response to the first clock signal pulse following receipt of a start command from a computer 22 transmitted by way of a control and data bus 24 interconnecting digitizer 12 to computer 22. In accordance with instructions provided by computer 22 via bus 24, time base circuit 20 stops acquiring data after a predetermined number of data values have been stored in acquisition memory 18 or after the input signal reaches a predetermined trigger level. Computer 22 accesses the waveform data stored in acquisition memory 18 via bus 24. Digitizers similar to digitizer 12 are often utilized for digitizing input signals in digital oscilloscopes.

The effective bits of resolution of a digitizer is a measure of the resolution of the digitizer in terms of the number of bits of each element of its output data sequence that are substantially unaffected by quantization noise. A commonly used definition of effective bits of resolution is based on the assumption that the quantization noise is uniformly distributed throughout the range of a digitizer and that quantization errors from sample to sample are statistically independent. Based on these assumptions, the effective bits of resolution B of a digitizer is given by:

$$B = \text{Log}_2\left[\frac{\text{Fullscale}}{\sqrt{12} \ RMSE} + 1\right] \quad (1)$$

where Fullscale is the maximum magnitude of the digitizer output data and RMSE is the "root mean square error" of the digitized signal, or $$RMSE = \left[1/N \sum_{k=0}^{N-1} [s_k - s_k']^2\right]^{\frac{1}{2}} \quad (2)$$

where $S_k$ is the $k^{th}$ element of the output data sequence and $s'_k$ is the actual magnitude of the $k^{th}$ input signal sample.

The $k^{th}$ sample of a sinewave input signal has value in accordance with the equation:

$$s'_k = A \sin(2\pi kf/f_s + \theta) + D \quad (3)$$

where A is the amplitude of the sine wave, f is its frequency, $\theta$ is its phae angle, D is its offset, and $f_s$ is the digitizer sampling frequency. In accordance with the present invention, to measure the effective bits of resolution of digitizer 12, a sinewave signal generated by a sinewave generator 26 is applied through a switch 28 controlled by computer 22 as the input signal to digitizer 12 instead of an externally generated input signal. The amplitude, frequency, phase angle and offset parameters characterizing the sinewave input signal are then estimated by computer 22 by analyzing a waveform data sequence produced by digitizer 12 in response to the sinewave input signal. Computer 22 then uses these estimated parameters to develop a model of the input signal similar to equation (3) and determines the effective bits of resolution of the digitizer in accordance with equations (1) and (2) wherein each value of $s'_k$ is determined from the model.

Figure 2:
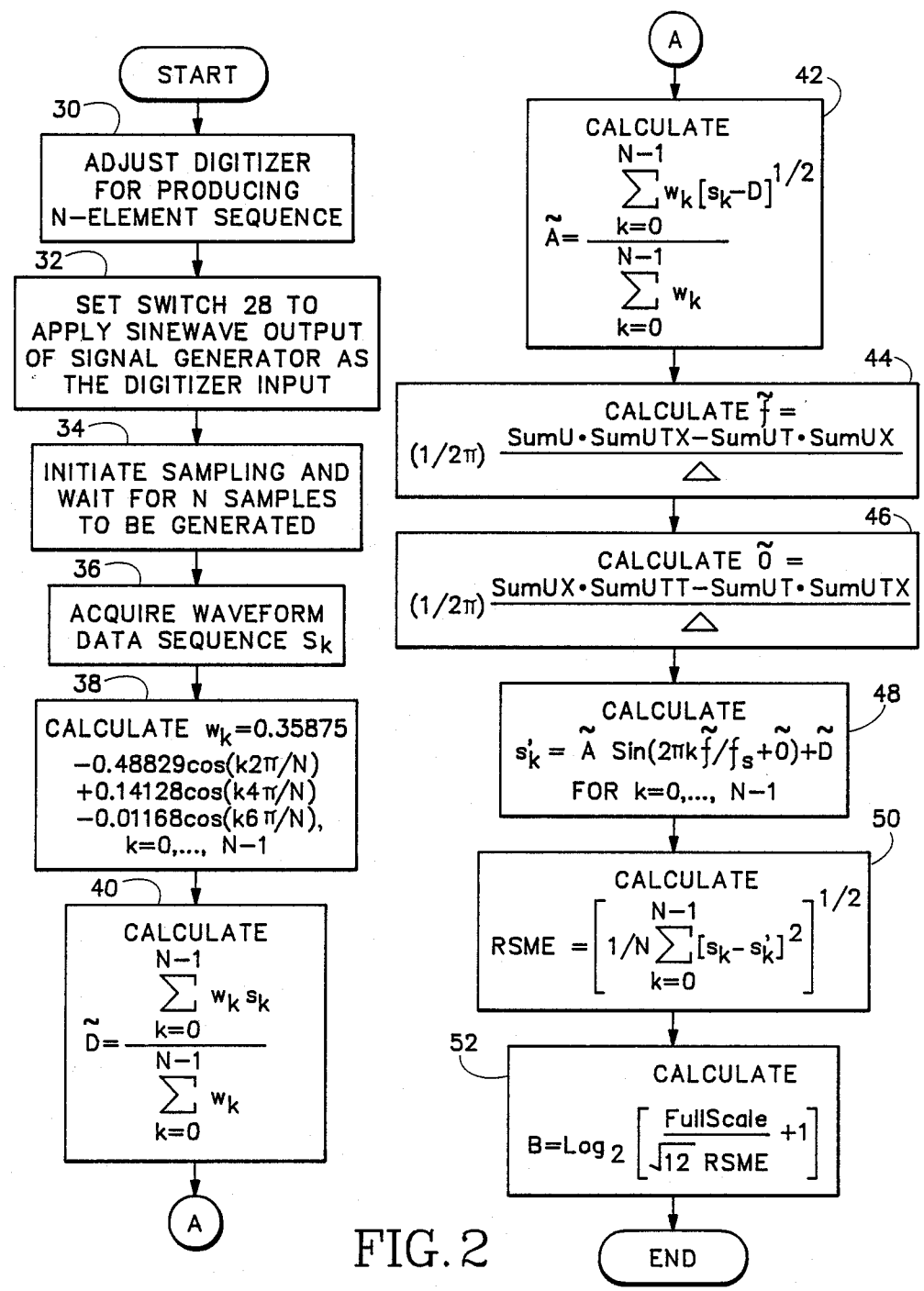

FIG. 2 is a flow chart for programming computer 22 to cause digitizer 12 of FIG. 1 to digitize a sinewave input signal, to compute parameters of the sinewave input signal based on the digitizer output, and to compute the effective bits of resolution of the digitizer. With reference to FIGS. 1 and 2, starting in step 30, computer 22 transnits control data to digitizer 22 to prepare it for generating an N-element data sequence where N is suitably 256. Next, computer 22 sets switch 28 of FIG. 1 to apply the sinewave output of signal generator 26 as the input signal to digitizer 22 (step 32) and then transmits a command to digitizer 22 to initiate sampling (step 34).

After the digitizer has acquired N samples and stored them as an N-element waveform data sequence $s_k$ in acquisition memory 18, computer 22 acquires the waveform data sequence (step 36) from the acquisition memory and calculates (step 38) a window sequence $W=\{w_k, k=0, 1, \ldots, N-1\}$ where $w_k$ is given by $$w_k = 0.35875 - 0.48829 \cos(k2\pi/N) + 0.14128 \cos(k4\pi/N) - 0.01168 \cos(k6\pi/N) \quad (4)$$

The window sequence is obtained by sampling the 4-term Blackman-Harris window described in the article "On the Use of Windows for Harmonic Analysis with the Discrete Fourier Transform", by F. J. Harris, Proceedings of the IEEE, Vol. 66, No. 1, January 1978, pp. 51-83, which article is incorporated herein by reference.

The DC offset parameter D for the sinewave input signal is then estimated (step 40) in accordance with the following equation:

$$\tilde{D} = \sum_{k=0}^{N-1} w_k s_k \Big/ \sum_{k=0}^{N-1} w_k. \quad (5)$$

The "~" symbol is used to identify the variable as an estimate of the actual value of the offset parameter D.

The amplitude parameter A for the sinewave input signal is estimated next (step 42) in accordance with the equation $$\tilde{A} = \sum_{k=0}^{N-1} w_k [s_k - \tilde{D}]^{\frac{1}{2}} \Big/ \sum_{k=0}^{N-1} w_k. \quad (6)$$

The frequency and phase angle parameters of the input sinewave signal are then estimated (steps 44 and 46) in accordance with the equations:

$$\tilde{f} = (\tfrac{1}{2}\pi) \frac{\text{Sum}U \cdot \text{Sum}UTX - \text{Sum}UT \cdot \text{Sum}UX}{\Delta}. \quad (7)$$

$$\tilde{\theta} = (\tfrac{1}{2}\pi) \frac{\text{Sum}UX \cdot \text{Sum}UTT - \text{Sum}UT \cdot \text{Sum}UTX}{\Delta}. \quad (8)$$

where
$\text{Sum}U = \Sigma u_k$
$\text{Sum}UT = \Sigma u_k t_k$
$\text{Sum}UTT = \Sigma u_k t_k t_k$
$\text{Sum}UX = \Sigma u_k x_k$
$\text{Sum}UTX = \Sigma u_k t_k x_k$
$\Delta = \text{Sum}U \cdot \text{Sum}UTT - \text{Sum}UT \cdot \text{Sum}UT$
$\hat{s}_k = (s_k - D)/A$, $k=0, 1, \ldots, N-1$
$u_k = 1 - (\hat{s}_k)^2$, $k=0, 1, \ldots, N-1$
$x_k = \arcsin(\hat{s}_k)$, subject to monotonic condition, (i.e., $X_k$ increasing monotonically as k increases) and
$t_k = k/f_s$, $k=0, 1, \ldots, N-1$ Thereafter (step 48), the sequence $\{s'_k, k=0, \ldots, N-1\}$ is computed in accordance with the equation:

$$s'_k = \tilde{A} \sin(2\pi k \tilde{f}/f_s = \tilde{\theta}) + \tilde{D} \quad (9)$$

Finally (steps 50 and 52), the root mean square error RMSE and the effective bits of resolution B of digitizer 12 is computed as follows:

$$B = \log_2 \left[ \frac{\text{FullScale}}{\sqrt{12} \; \text{RMSE}} + 1 \right] \quad (10)$$

where $$\text{RMSE} = \left[ 1/N \sum_{k=0}^{N-1} [s_k - s_k']^2 \right]^{\frac{1}{2}} \quad (11)$$

The basic principle from which equations (5) and (6) are derived is Poisson's summation formula. If $\phi(t)$ is an arbitrary function and $\Phi(w)$ its Fourier transform, then Poisson's summation formula states:

$$\sum_{k=-\infty}^{\infty} \phi(kT) = 1/T \sum_{k=-\infty}^{\infty} \Phi(k2\pi/T). \quad (12)$$

If the sampling frequency $f_s = 1/T$ is sufficiently large, such that $\Phi(k2\pi f_s)$ is zero for non-zero k (i.e., no aliasing), then equation (12) becomes $$\sum_{k=-\infty}^{\infty} \phi(k/f_s) = f_s \phi(0). \quad (13)$$

Let us consider the DC-offset estimator first. The sinewave $s(t) = A \sin(w_o t + \theta) + D$, where $w_o = 2\pi f$, has a Fourier transform $S(w) = j\pi A \delta(w + w_o) \exp(-j\theta) - j\pi A \delta(w - w_o) \exp(j\theta) + 2\pi D \delta(w)$, where $\delta()$ is the delta function. Let $W(w)$ be the Fourier transform of the window function $w(t)$, the 4-term Blackman-Harris window whose samples are given by equation (4), then the Fourier transform, $G(w)$, of the product function $g(t) = w(t) \cdot [A \sin(wt + \theta) + D]$, is the frequency domain convolution of $S(w)$ and $W(w)$, i.e., $$G(w) = DW(w) + (jA/2)W(w=w_o)e^{-j\theta} - (jA/2)W(w-w_o)e^{j\theta}. \quad (14)$$

By substituting w=0 into equation (14), we have $$\begin{aligned} G(0) &= DW(0) + (jA/2)W(w_o)e^{-j\theta} - (jA/2)W(-w_o)e^{j\theta} \\ &= DW(0) + E_D(A, \theta, w_o) \end{aligned} \quad (15)$$

where $E_D()$ is the error term. Assuming no aliasing and applying Poisson's summation formula (12) to equation (15), we have $$D \sum_{k=0}^{N-1} w_k = \sum_{k=0}^{N-1} w_k s_k - f_s E_D(A, \theta, w_o). \quad (16)$$

The DC-offset estimator $\tilde{D}$ of equation (5) is obtained by dropping the last term of equation (16). Let us denote the difference between D and $\tilde{D}$ by $\Delta D$, i.e., $\Delta D = D - \tilde{D}$, then we have $$\Delta D = \frac{A|W(w_o)|\sin(\theta + w_o N/2 f_s)}{W(0)}. \quad (17)$$

If the data record S contains more than four cycles of the sinewave, then $|\Delta D|$ is less than $|A| \cdot 10^{-9.2}$. In practice, if the additive noise (such as the quantization noise introduced by the waveform digitizer) is included, then an additional error term of approximately the size of $\sigma/(N)^{\frac{1}{2}}$ should be added, where $\sigma$ is the standard deviation of the additive noise.

We now turn our attention to the amplitude estimator $\tilde{A}$. Let $h(t) = w(t) \cdot [s(t) - D]^2$, then the Fourier transform of h(t) is $$H(w)=(A^2/2)W(w)-(A^2/4)[W(w+2w_o)e^{-j2\theta}+W(w-2w_o)e^{j2\theta}].$$

By substituting $w=0$ into the above equation, we have $$H(0) = (A^2/2)W(0) - (A^2/4)[W(2w_o)e^{-j2\theta} + W(-2w_o)e^{j2\theta}] \quad (18)$$
$$= (A^2/2)W(0) - E_A(A, \theta, w_o)$$

where $E_A()$ is the error term. Again by assuming no aliasing and by applying Poisson's summation formula, we have $$A^2 \sum_{k=0}^{N-1} w_k = 2 \sum_{k=0}^{N-1} w_k(s_k - D)^2 + f_s 2 E_A (A, \theta, w_o) \quad (19)$$

The amplitude estimator $\tilde{A}$ of (6) is obtained from (19) by substituting $\tilde{D}$ for D and dropping the last term in the above equation. Let $\Delta A^2$ be $A^2 - \tilde{A}^2$, then from (18) and (19) we have $$\Delta A^2 = \frac{A^2 |W(2w_o)| \cos(2\theta + w_o N/f_s)}{W(0)}. \quad (20)$$

Under the condition that the data record S contain at least four cycles, the normalized error $\Delta A/A$ is upper-bounded by $10^{-4.6}$.

As for the frequency estimator, $\tilde{f}$, the normalized standard deviation $\text{std}(\tilde{f})/f$ of the frequency estimator given in equation (7) is given by $$\text{std}(\tilde{f})/f = 2.2\sigma/(m.n^3)^{\frac{1}{2}}$$

where m is the number of samples per period, n is the number of half periods covered in the data record, and $\sigma$ is the standard deviation of the additive noise. The exact form of the phase estimator error is not available; however, it can be shown to be in the order of $\sigma/(N)^{\frac{1}{2}}$.

Equations (17) and (20) give the closed form expressions for the errors encountered in the algorithm. It can be shown that $20 \log \{W(f)/W(0)\}$ is less than 92 dB for all f with $Nf/f_s$ greater than 4. Hence, if the data record contains more than four cycles of sinewave, then the normalized errors $\Delta D/A$ and $\Delta A^2/A^2$ are less than $-92$ dB. It is also clear from (17) and (20) that errors are also functions of the phase angle $\theta$. However, it is of little use trying to control errors through the phase angle because in practice there is no easy way to control the phase angle of the incoming sampled sinewave. Nevertheless, from the estimated $\theta$, equations (17) and (20) give some indications of the accuracy of the estimated values.

Assuming the dominant time-consuming operations in carrying out the method of FIG. 2 are multiplications and divisions, then the number of operations is about 20N. In an IBM model AT minicomputer using an Intel 80287 coprocessor, it takes about 200 microseconds to do one operation, hence the calculations will take about one second for a 256-point data record. Of course, it takes a little longer to execute the calculations in reality, because there are overheads and other operations such as additions and data movements involved.

Thus has been shown and described a method and an apparatus for measuring the effective bits of resolution of a digitizer wherein the amplitude, frequency, phase angle and offset parameters characterizing a sinewave input signal to a digitizer are estimated from the waveform data sequence produced by the digitizer in response to the input signal. These estimated parameters are used to develop a model of the input signal and the effective bits of resolution of the digitizer are then determined by comparing each data element of the waveform data sequence to an estimated magnitude of the input signal at the associated sampling time, the estimated magnitude being determined from the model. Estimation of the four sinewave parameters in accordance with the present invention is non-iterative and is carried out quickly, with high precision by a digital computer. Estimation errors are obtained in closed form and can therefore be controlled. The measurement of effective bits of resolution of a digitizer utilizing a sinewave model developed from estimated parameters, rather than from known parameters of an input signal, gives consistent, highly accurate results for digitizers with effective resolutions as low as three bits. The present invention may also be used to measure parameters of a sinewave signal by applying the sinewave signal as input to a digitizer and computing offset, amplitude, frequency and phase angle parameters in accordance with equations 5–8.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. An apparatus for measuring the effective resolution of a digitizer of the type which samples an input signal at a sampling frequency $f_s$ and produces a sequence of digital data representing sampled magnitudes of said input signal, the apparatus comprising:

means for generating a sinewave signal, said sinewave signal being applied as said input signal to said digitizer such that said digitizer produces an N-element distal data sequence representing measured magnitudes of said sinewave signal; and means responsive to said digital data sequence for determining therefrom estimated amplitude, frequency, phase angle and offset parameters characterizing said sinewave signal, for computing in accordance with said estimated parameters a set of data values representing estimated magnitudes of said sinewave signal, and for determining the effective resolution of said digitizer in accordance with a combination of differences between said measured magnitudes and said estimated magnitudes of said sinewave signal.

2. The apparatus in accordance with claim 1 wherein said means responsive to said digital data sequence comprises a digital computer having means for obtaining said digital data sequence from said digitizer.

3. The apparatus in accordance with claim 1 wherein said means responsive to said digital data sequence determines the offset parameter $\tilde{D}$ in accordance with the equation $$\tilde{D} = \sum_{k=0}^{N-1} w_k s_k / \sum_{k=0}^{N-1} w_k$$

where $w_k$ is the $k^{th}$ element of an N-element window sequence and $s_k$ is the $k^{th}$ element of the N-element waveform data sequence.

4. The apparatus in accordance with claim 3 wherein said means responsive to said digital data sequence determines the amplitude parameter $\widetilde{A}$ in accordance with the equation $$\widetilde{A} = \sum_{k=0}^{N-1} w_k [s_k - \widetilde{D}]^2 / \sum_{k=0}^{N-1} w_k.$$

5. The apparatus in accordance with claim 1 wherein said means responsive to said digital data sequence determines the offset parameter $\widetilde{D}$ in accordance with the equation $$\widetilde{D} = \sum_{k=0}^{N-1} w_k s_k / \sum_{k=0}^{N-1} w_k,$$

determines the amplitude parameter $\widetilde{A}$ in accordance with the equation $$\widetilde{A} = \sum_{k=0}^{N-1} w_k [s_k - \widetilde{D}]^2 / \sum_{k=0}^{N-1} w_k,$$

determines the frequency parameter $\widetilde{f}$ in accordance with the equation $$\widetilde{f} = (\tfrac{1}{2}\pi) \frac{Sum U \cdot Sum UTX - Sum UT \cdot Sum UX}{\Delta},$$

and determines the phase angle parameter $\widetilde{\theta}$ in accordance with the equation $$\widetilde{\theta} = (\tfrac{1}{2}\pi) \frac{Sum UX \cdot Sum UTT - Sum UT \cdot Sum UTX}{\Delta},$$

where $w_k$ is the $k^{th}$ element of an N-element window sequence and $s_k$ is the $k^{th}$ element of the N-element waveform data sequence, and where $Sum U = \Sigma u_k$ $Sum UT = \Sigma u_k t_k$ $Sum UTT = \Sigma u_k t_k t_k$ $Sum UX = \Sigma u_k x_k$ $SUM UTX = \Sigma u_k t_k x_k$ $\Delta = Sum U \cdot Sum UTT - Sum UT \cdot Sum UT$ $\hat{s}_k = (s_k - \widetilde{D})/\widetilde{A},\ k=0, 1, \ldots, N-1$ $u_k = 1 - (\hat{s}_k)^2,\ k=0, 1, \ldots, N-1$ $x_k = \arcsin(\hat{s}_k)$ and $t_k = k/f_s,\ k=0, 1, \ldots, N-1.$ 6. The apparatus in accordance with claim 5 wherein Fullscale is a largest possible value of digitizer output data and wherein said means responsive to said digital data sequence determines said resolution B in accordance with the equations:

$$B = \text{Log}_2 \left[ \frac{\text{Fullscale}}{\sqrt{12}\ RMSE} + 1 \right]$$

$$RMSE = \left[ 1/N \sum_{k=0}^{N-1} [s_k - s'_k]^2 \right]^{\frac{1}{2}}$$

and $s'_k = A \sin(2\pi k \widetilde{f}/f_s + \widetilde{\theta}) + \widetilde{D}.$ 7. An apparatus for measuring the offset D of a sinewave signal comprising:
digitizer means responsive to said sinewave signal for generating an N-element sequence of digital data, each datum of said sequence representing an instantaneous magnitude of said sinewave signal at a separate one of a plurality of successive sampling times, said successive sampling times being separated by substantially equal intervals;
a computer responsive to said data sequence for calculating said offset D in accordance with the equation:

$$D = \sum_{k=0}^{N-1} w_k s_k / \sum_{k=0}^{N-1} w_k$$

where $w_k$ is the $k^{th}$ element of an N-element window sequence and $s_k$ is the $k^{th}$ element of the N-element waveform data sequence.

8. An apparatus for measuring the offset D and amplitude A of a sinewave signal comprising:
digitizer means responsive to said sinewave signal for generating an N-element sequence of digital data, each datum of said sequence representing an instantaneous magnitude of said sinewave signal at a separate one of a plurality of successive sampling times, said successive sampling times being separated by substantially equal intervals;
a computer responsive to said data sequence for calculating said amplitude A and said offset D in accordance with the equations:

$$D = \sum_{k=0}^{N-1} w_k s_k / \sum_{k=0}^{N-1} w_k$$

$$A = \sum_{k=0}^{N-1} w_k [s_k - D]^2 / \sum_{k=0}^{N-1} w_k$$

where $w_k$ is the $k^{th}$ element of an N-element window sequence and $s_k$ is the $k^{th}$ element of the N-element waveform data sequence.

9. A method for measuring the effective resolution of a digitizer of the type which samples an input signal of a sampling frequency $f_s$ and produces a sequence of digital data representing sampled magnitudes of said input signal, the method comprising the steps of:
generating a sinewave signal and applying said sinewave signal as said input signal to said digitizer such that said digitizer produces an N-element digital data sequence representing measured magnitudes of said sinewave signal;
computing in accordance with said digital data sequence estimated amplitude, frequency, phase angle and offset parameters characterizing said sinewave signal;

computing in accordance with said estimated parameters estimated magnitudes of said sinewave signal;

computing differences between said measured magnitudes and said estimated magnitudes; and computing the resolution of said digitizer in accordance with said computed differences.

10. The method in accordance with claim 9 wherein said estimated offset parameter D is computed in accordance with the equation $$D = \sum_{k=0}^{N-1} w_k s_k / \sum_{k=0}^{N-1} w_k$$

where $w_k$ is the $k^{th}$ element of an N-element window sequence and $s_k$ is the $k^{th}$ element of the N-element waveform data sequence.

11. The method in accordance with claim 10 wherein said estimated amplitude parameter A is computed in accordance with the equation $$A = \sum_{k=0}^{N-1} w_k [s_k - D]^{\frac{1}{2}} / \sum_{k=0}^{N-1} w_k.$$

12. The method in accordance with claim 11 wherein said frequency parameter f, and said phase angle parameter $\theta$ are computed in accordance with the equations $$f = (\tfrac{1}{2}\pi) \frac{\text{Sum}U \cdot \text{Sum}UTX - \text{Sum}UT \cdot \text{Sum}UX}{\Delta}$$

and $$\theta = (\tfrac{1}{2}\pi) \frac{\text{Sum}UX \cdot \text{Sum}UTT - \text{Sum}UT \cdot \text{Sum}UTX}{\Delta}$$

where $\text{Sum}U = \Sigma u_k$ $\text{Sum}UT = \Sigma u_k t_k$ $\text{Sum}UTT = \Sigma u_k t_k t_k$ $\text{Sum}UX = \Sigma u_k x_k$ $\text{Sum}UTX = \Sigma u_k t_k x_k$ $\Delta = \text{Sum}U \cdot \text{Sum}UTT - \text{Sum}UT \cdot \text{Sum}UT$ $\hat{s}_k = (s_k - \widetilde{D})/\widetilde{A}$, $k = 0, 1, \ldots, N-1$ $u_k = 1 - (\hat{s}_k)^2$, $k = 0, 1, \ldots, N-1$ $x_k = \arcsin(\hat{s}_k)$ and $t_k = k/f_s$, $k = 0, 1, \ldots, N-1$.

13. The method in accordance with claim 12 wherein Fullscale is a largest possible value of digitizer output data and wherein said effective resolution B is computed in accordance with the equation:

$$B = \text{Log}_2 \left[ \frac{\text{Fullscale}}{\sqrt{12} \ \text{RMSE}} + 1 \right],$$

where $$RMSE = \left[ 1/N \sum_{k=0}^{N-1} [s_k - s_k']^2 \right]^{\frac{1}{2}}$$

and $s'_k = A \sin(2\pi k f/f_s + \theta) + D.$

* * * * *